United States Patent
Shoubu et al.

(10) Patent No.: US 11,564,305 B2
(45) Date of Patent: Jan. 24, 2023

(54) MALFUNCTION DETECTION DEVICE, LIGHT-EMISSION DRIVING DEVICE, AND LIGHT EMITTING DEVICE

(71) Applicant: SONY SEMICONDUCTOR SOLUTIONS CORPORATION, Kanagawa (JP)

(72) Inventors: Hiroyuki Shoubu, Kanagawa (JP); Hayato Kamizuru, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/435,870

(22) PCT Filed: Jan. 24, 2020

(86) PCT No.: PCT/JP2020/002475
§ 371 (c)(1),
(2) Date: Sep. 2, 2021

(87) PCT Pub. No.: WO2020/183935
PCT Pub. Date: Sep. 17, 2020

(65) Prior Publication Data
US 2022/0151049 A1    May 12, 2022

(30) Foreign Application Priority Data
Mar. 13, 2019 (JP) .............................. JP2019-045442

(51) Int. Cl.
*H05B 45/50* (2022.01)
*H05B 47/20* (2020.01)
*G01S 7/497* (2006.01)

(52) U.S. Cl.
CPC .............. *H05B 47/20* (2020.01); *G01S 7/497* (2013.01)

(58) Field of Classification Search
CPC ........ H05B 45/00; H05B 45/14; H05B 45/30; H05B 45/50; H05B 47/20; H05B 47/24; H05B 47/26; H05B 41/285
See application file for complete search history.

(56) References Cited

U.S. PATENT DOCUMENTS

2007/0171947 A1* 7/2007 Bell .................... H01S 5/06825
  372/38.08
2011/0025234 A1* 2/2011 Ohtaka .................. H05B 45/50
  315/307

(Continued)

FOREIGN PATENT DOCUMENTS

JP    2011-035134 A    2/2011
JP    2011-198971 A    10/2011

(Continued)

OTHER PUBLICATIONS

International Search Report and Written Opinion of PCT Application No. PCT/JP2020/002475, dated Apr. 14, 2020, 12 pages of ISRWO.

*Primary Examiner* — Thai Pham
(74) *Attorney, Agent, or Firm* — Chip Law Group

(57) ABSTRACT

To detect a malfunction of a light-emission driving unit that drives a light emitting element in a light-emission driving device. A malfunction detection device is provided to the light-emission driving device including the light-emission driving unit that supplies a light-emission current for causing the light emitting element to emit light during a light-emission period during which the light emitting element is caused to emit light. The malfunction detection device provided to this light-emission driving device detects, on the basis of a voltage of an output terminal, a malfunction of the light-emission driving unit, the output terminal being a terminal in the light-emission driving unit that supplies the light-emission current for causing the light emitting element (Continued)

to emit light during the light-emission period, the terminal supplying the light-emission current.

8 Claims, 8 Drawing Sheets

(56) References Cited

U.S. PATENT DOCUMENTS

| | | | |
|---|---|---|---|
| 2012/0074856 A1* | 3/2012 | Takata | G09G 3/3406 315/192 |
| 2012/0235574 A1 | 9/2012 | Sumi et al. | |
| 2012/0248997 A1* | 10/2012 | Jung | H05B 45/37 315/192 |

FOREIGN PATENT DOCUMENTS

| | | | |
|---|---|---|---|
| JP | 2012-160436 A | | 8/2012 |
| JP | 2013-131348 A | | 7/2013 |
| JP | 2013131348 A | * | 7/2013 |
| JP | 2017-016919 A | | 1/2017 |
| JP | 2019-041201 A | | 3/2019 |
| WO | 2011/040512 A1 | | 4/2011 |
| WO | 2019/039312 A1 | | 2/2019 |

\* cited by examiner

MALFUNCTION DETECTION DEVICE, LIGHT-EMISSION DRIVING DEVICE, AND LIGHT EMITTING DEVICE

CROSS REFERENCE TO RELATED APPLICATIONS

This application is a U.S. National Phase of International Patent Application No. PCT/JP2020/002475 filed on Jan. 24, 2020, which claims priority benefit of Japanese Patent Application No. JP 2019-045442 filed in the Japan Patent Office on Mar. 13, 2019. Each of the above-referenced applications is hereby incorporated herein by reference in its entirety.

TECHNICAL FIELD

The present disclosure relates to a malfunction detection device, a light-emission driving device, and a light emitting device. Specifically, the present disclosure relates to a malfunction detection device that detects a malfunction of a light emitting element, a light-emission driving device including the malfunction detection device, and a light emitting device.

BACKGROUND ART

In the past, a distance measuring device for measuring the distance to a subject has been used in an imaging apparatus such as an in-vehicle camera. As the distance measuring device, for example, a device for measuring the distance by measuring the time until the light reflected from a subject is detected since a laser beam is applied to the subject is used. In such a device that applies a laser beam to a subject, a malfunction detection device for preventing excessive application of the laser beam due to a malfunction or the like is required. This is for protecting a subject such as a person.

As such a malfunction detection device, for example, an LED short-circuit detection circuit for detecting a short-circuit of an LED chip in a light source in which a plurality of light-emitting diode (LED: Light Emitting Diode) chips is connected in series has been proposed (see, for example, Patent Literature 1). In this LED short-circuit detection circuit, a short-circuit of the LED chip is detected by comparing the applied voltage of the LED chips connected in series and the voltage of the node between the chips with each other.

CITATION LIST

Patent Literature

Patent Literature 1: Japanese Patent Application Laid-open No. 2012-160436

DISCLOSURE OF INVENTION

Technical Problem

The existing technology described above has a problem that a malfunction of a drive device for driving a light emitting element cannot be detected. In the case where an overcurrent flows through the light emitting element due to the malfunction of the drive device, there is a possibility that light of high intensity is applied from a light source and a subject is damaged. The existing technology described above has a problem that such a malfunction cannot be detected.

The present disclosure has been made in view of the above-mentioned problems, and an object of the present disclosure is to detect a malfunction of a drive device for driving a light emitting element.

Solution to Problem

The present disclosure has been made to solve the above-mentioned problems, and a first embodiment thereof is a malfunction detection device that detects, on the basis of a voltage of an output terminal, a malfunction of a light-emission driving unit, the output terminal being a terminal in a light-emission driving unit that supplies a light-emission current for causing a light emitting element to emit light during a light-emission period, the terminal supplying the light-emission current.

Further, in this first embodiment, the malfunction may be detected in the light-emission period and in a non-light-emission period in which light emission of the light emitting element is stopped.

Further, in this first embodiment, the malfunction may be detected by comparing the voltage of the output terminal and a predetermined threshold value with each other.

Further, in this first embodiment, the predetermined threshold value in the non-light-emission period may be different from that in the light-emission period.

Further, in this first embodiment, the malfunction may be detected, where the light-emission driving unit intermittently supplies the light-emission current in the light-emission period, for each of the intermittently supplied light-emission currents.

Further, in this first embodiment, the malfunction detection device may further include a low-pass filter that removes a high-frequency component of the voltage of the output terminal, in which the malfunction may be detected on the basis of the voltage of the output terminal from which the high-frequency component has been removed.

Further, a second embodiment of the present disclosure is a light-emission driving device, including: a light-emission driving unit that supplies a light-emission current for causing a light emitting element to emit light during a light-emission period; and a malfunction detection unit that detects a malfunction of the light-emission driving unit on the basis of a voltage of an output terminal, the output terminal being a terminal in the light-emission driving unit, the terminal supplying the light-emission current.

Further, in this second embodiment, the light-emission driving device may further include: a power source unit that supplies power for causing the light-emission current to flow in the light emitting element; and a power source control unit that causes, where the malfunction is detected, the power source unit to stop supplying the power.

Further, a third embodiment of the present disclosure is a light emitting device, including: a light emitting element; a light-emission driving unit that supplies a light-emission current for causing the light emitting element to emit light during a light-emission period; and a malfunction detection unit that detects a malfunction of the light-emission driving unit on the basis of a voltage of an output terminal, the output terminal being a terminal in the light-emission driving unit, the terminal supplying the light-emission current.

By adopting such an embodiment, the effect of determining a malfunction of a light-emission driving unit on the basis of a voltage of an output terminal is achieved.

MODE(S) FOR CARRYING OUT THE INVENTION

Next, embodiments for carrying out the present disclosure (hereinafter, referred to as embodiments) will be described with reference to the drawings. In the accompanying drawings, the same or similar portions will be denoted by the same or similar reference symbols. Further, the embodiments will be described in the following order.
1. First Embodiment
2. Second Embodiment
3. Third Embodiment
4. Application example to camera

1. First Embodiment

[Light Emitting Device]

Figure 1:
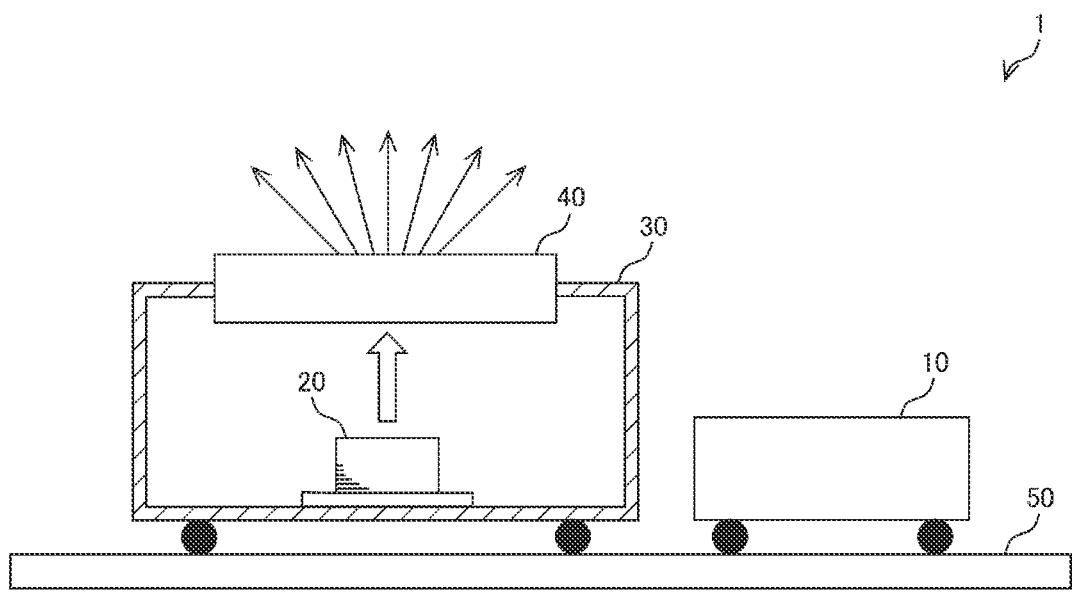
FIG. 1 is a diagram showing a configuration example of a light emitting device according to an embodiment of the present disclosure.

FIG. 1 is a diagram showing a configuration example of a light emitting device according to an embodiment of the present disclosure. FIG. 1 is a diagram showing an outline of a light emitting device 1. The light emitting device 1 in the figure includes a light emitting element 20, a light emission unit 40, a casing 30, a light-emission driving device 10, and a substrate 50. The light emitting device 1 is, for example, a light emitting device used as a device for measuring a distance from a subject by a ToF (Time of Flight) method in a camera or the like. Here, the ToF method is a method of measuring a distance by applying a laser beam to a subject and measuring the time period during which the laser beam reciprocates between the device and the subject. Further, the light emitting device can be used as a device for recognizing the three-dimensional shape of a subject by the reflected laser beam.

The light emitting element 20 is disposed in the casing 30 and emits a laser beam. The light emission unit 40 is disposed on the top plate of the casing 30. This light emission unit 40 protects the light emitting element 20 and causes a laser beam to be transmitted therethrough. Further, a diffusion plate is disposed in the light emission unit 40 and converts the laser beam from the light emitting element 20 into diffused light beams. A laser light of point (one-dimensional) emission is converted into laser light beams of plane (two-dimensional) emission by this light emission unit 40. A three-dimensional mapping of a subject can be performed by applying this laser beam of plane emission to the subject, imaging the laser beam reflected by the subject, and acquiring distance information for each pixel of an image sensor. An outlined arrow in the figure represents the laser beam emitted by the light emitting element 20, and solid arrows represent the laser beams converted into diffused light beams by the light emission unit 40.

The light-emission driving device 10 is an electronic circuit for driving the light emitting element 20. The light-emission driving device 10 and the casing 30 are mounted on the substrate 50. FIG. 1 shows an example in which they are mounted by using solder balls.

A laser beam has a high energy density and there is a high possibility of causing a human body to have a disability when the laser beam is directly applied to an eyeball or the like. Usually, the intensity of the laser beam applied from the light emitting element 20 is controlled to be specified intensity by the light-emission driving device 10. However, when the light-emission driving device 10 has a malfunction, a laser beam of high intensity is output from the light emitting element 20 in some cases. In such a case, a malfunction detection device for quenching the light emitting element 20 is required.

[Light-Emission Driving Device]

Figure 2:
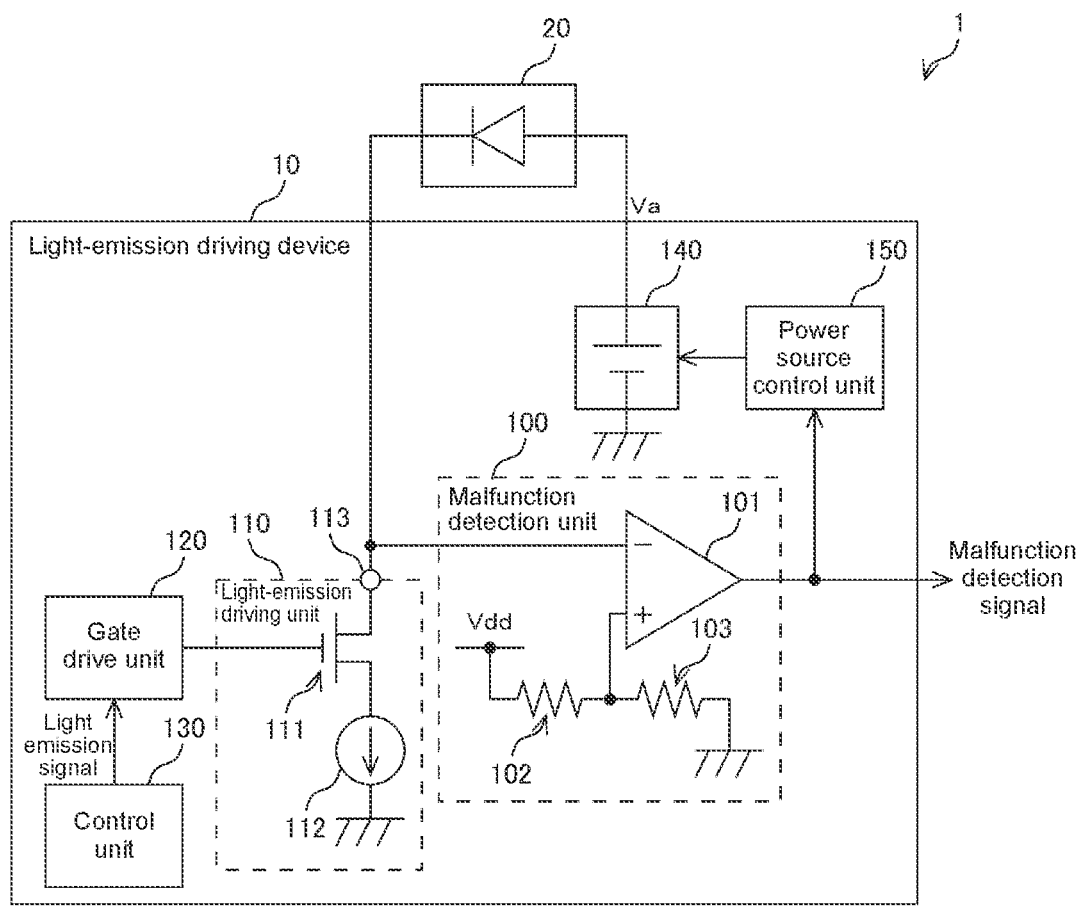
FIG. 2 is a diagram showing a configuration example of a light emitting device according to a first embodiment of the present disclosure.

FIG. 2 is a diagram showing a configuration example of a light emitting device according to a first embodiment of the present disclosure. FIG. 2 is a block diagram showing a configuration example of the light emitting device 1. The light emitting device 1 in the figure includes the light emitting element 20 and the light-emission driving device 10.

The light emitting element 20 is a light emitting element that emits a laser beam as described above. This light emitting element 20 can be caused to emit light by causing a specified light-emission current to flow in the light emitting element 20. Hereinafter, the period during which the light emitting element 20 is caused to emit light will be referred to as the light-emission period, and the period in which the light emission of the light emitting element 20 is stopped will be referred to as the non-light-emission period. As this light emitting element 20, for example, a laser diode can be used. The light-emission current is a current having a value equal to or higher than a light emission threshold value of the light emitting element 20 and is a current for achieving light emission of desired light intensity.

The light-emission driving device 10 includes a malfunction detection unit 100, a light-emission driving unit 110, a gate drive unit 120, a control unit 130, a power source unit 140, and a power source control unit 150.

The power source unit 140 supplies power for causing the light-emission current to flow in the light emitting element 20. A constant-voltage source can be applied to the power source unit 140. The power source unit 140 in the figure applies a predetermined power supply voltage with the ground point as a reference to the anode of the light emitting element 20.

The power source control unit 150 controls the power source unit 140. This power source control unit 150 controls, on the basis of a malfunction detection signal output from the malfunction detection unit 100 described below, supplying of power to the light emitting element 20 of the power source unit 140 and stopping of the supplying. Specifically, the power source control unit 150 causes, in the case where the malfunction detection unit 100 has detected a malfunction of the light-emission driving unit 110, the power source unit 140 to stop the supplying of power to the light emitting element 20.

The light-emission driving unit 110 is a circuit that supplies the light-emission current to the light emitting element 20. The light-emission driving unit 110 in the figure includes an output terminal 113. This output terminal 113 is connected to the cathode of the light emitting element 20, and supplies the light-emission current of the light emitting element 20 as a sink current. The light-emission driving unit 110 in the figure includes a MOS transistor 111 and a constant-current circuit 112. The drain of the MOS transistor 111 is connected to the output terminal 113, and the gate thereof is connected to the gate drive unit 120 described below. The source of the MOS transistor 111 is connected to one end of the constant-current circuit 112. The other end of the constant-current circuit 112 is grounded.

The constant-current circuit 112 is a circuit that causes a predetermined constant current to flow, and is a circuit that limits the current flowing through the light emitting element 20 to a predetermined value in accordance with the power supply voltage supplied from the power source unit 140 described below. The constant-current circuit 112 in the figure is a circuit that causes the light-emission current to flow as this predetermined constant current. The constant-current circuit 112 can include, for example, a MOS transistor to which a gate voltage corresponding to the light-emission current is supplied.

The MOS transistor 111 controls the light-emission current. This MOS transistor 111 supplies the light-emission current to the output terminal 113 of the constant-current circuit 112 when the MOS transistor 111 itself is made conductive. As the MOS transistor 111 in the figure, an n-channel MOS transistor can be used. As shown in the figure, the light emitting element 20, the MOS transistor 111, and the constant-current circuit 112 connected in series are connected between the output of the power source unit 140 and the ground to form a closed circuit. When the MOS transistor 111 is made conductive, the power supply voltage supplied from the power source unit 140 causes a current to flow through the light emitting element 20. This current flowing through the light emitting element 20 is limited to the light-emission current by the constant-current circuit 112. As described above, the light-emission driving unit 110 drives the light emitting element 20 and supplies the light-emission current from the sink-side.

The gate drive unit 120 controls switching between conduction and non-conduction of the switch element of the light-emission driving unit 110. Specifically, the gate drive unit 120 applies a predetermined a gate voltage to the gate of the above-mentioned MOS transistor 111 to cause the MOS transistor 111 to transition from a non-conductive state to a conductive state. Hereinafter, the gate voltage for conducting the MOS transistor 111 will be referred to as an on-voltage.

The control unit 130 controls the gate drive unit 120. Specifically, the control unit 130 generates a light emission signal in the light-emission period, and outputs the generated signal to the gate drive unit 120. The gate drive unit 120 to which the light emission signal has been input generates an on-voltage and outputs the generated on-voltage to the gate of the MOS transistor 111. As a result, it is possible to cause the light emitting element 20 to emit light during the light-emission period.

The malfunction detection unit 100 detects a malfunction of the light-emission driving unit 110. This malfunction detection unit 100 detects a malfunction of the light-emission driving unit 110 on the basis of the voltage of the output terminal 113 of the light-emission driving unit 110. The malfunction detection unit 100 in the figure includes a comparison unit 101 and resistances 102 and 103. The inverting input of the comparison unit 101 is connected to the output terminal 113. The resistance 102 is connected between a power source line Vdd and the non-inverting input of the comparison unit 101. The resistance 103 is connected between the non-inverting input of the comparison unit 101 and the ground. The output of the comparison unit 101 is connected to the output signal line of the malfunction detection unit 100. Note that the power source line Vdd is a signal line for supplying power of the malfunction detection unit 100.

The comparison unit 101 compares the voltage applied to the inverting input and the voltage applied to the non-inverting input with each other. As shown in the figure, the non-inverting input of the comparison unit 101 is connected to the node between the resistances 102 and 103 connected in series. The voltage obtained by dividing the power supply voltage of the power source line Vdd by the resistances 102 and 103 is applied to the non-inverting input of the comparison unit 101. The output of the comparison unit 101 has a high voltage level (e.g., the voltage of the power source line Vdd) when the voltage of the inverting input is lower than this applied voltage of the non-inverting input, and the output of the comparison unit 101 has a low voltage level (e.g., the ground potential) when the voltage of the inverting input is higher than the applied voltage of the non-inverting input. As described above, in the case where the voltage divided by the resistances 102 and 103 is used as a threshold value, the output of the comparison unit 101 has a high voltage level when the voltage of the output terminal 113 is lower than this threshold value. The signal of this high voltage level can be made to correspond to the malfunction detection signal.

As described above, the light-emission driving unit 110 controls the current flowing through the light emitting element 20 by the effect of the constant-current circuit 112. The voltage between the anode and the cathode of the light emitting element 20 varies with the flowing current. The constant-current circuit 112 supplies the light-emission current by controlling the voltage to be applied to the light emitting element 20 to the voltage corresponding to the light-emission current. For this reason, the voltage of the output terminal 113 is substantially equal to the voltage obtained by subtracting the applied voltage between the anode and the cathode of the light emitting element 20 at the time of light emission from the output voltage of the power source unit 140.

In the case where such a light-emission driving unit 110 has a malfunction, the voltage of the output terminal 113 is reduced. For example, in the case where the constant-current circuit 112 is short-circuited, the voltage of the output terminal 113 is reduced in the light-emission period as compared with the voltage in the normal state, and reaches substantially 0 V. As a result, an excessive voltage is applied to the light emitting element 20, and the amount of light is excessive. Note that the constant-current circuit 112 or the MOS transistor 111 is not completely short-circuited, resulting in a pseudo short-circuit malfunction in some cases. This is a malfunction in which the MOS transistor 111 or a MOS transistor constituting the constant-current circuit 112 does not transition to a non-conductive state, resulting in a low internal resistance. In the case where this pseudo short-circuit occurs, the voltage of the output terminal 113 becomes lower than that of the output terminal 113 in the normal state although not reduced to 0 V, the applied voltage of the light emitting element 20 increases, and the amount of light becomes excessive.

In this regard, the reduction in the voltage of the output terminal 113 is detected by the malfunction detection unit 100, and a short-circuit or pseudo short-circuit of the constant-current circuit 112 or the like is detected. The threshold value set by the resistances 102 and 103 is set to a voltage lower than the voltage of the output terminal 113 in the normal state, it is determined that the constant-current circuit 112 has a malfunction in the case where the voltage of the output terminal 113 is reduced to be lower than this threshold value, and thus, a malfunction detection signal can be output. This malfunction detection signal can be output to an external apparatus or the like as the output signal of the light-emission driving device 10. Further, this malfunction detection signal is output to the above-mentioned power source control unit 150, and the supplying of power in the power source unit 140 is stopped. As a result, it is possible to stop the light emission of the light emitting element 20 at the time of malfunction. Note that the malfunction detection unit 100 is an example of the malfunction detection device described in the claims.

Note that the configuration of the light-emission driving unit 110 is not limited to this example. For example, a circuit in which the MOS transistor 111 and the constant-current circuit 112 are replaced with each other and wired may be provided. Further, negative power may be supplied from the power source control unit 150. In this case, the output of the power source control unit 150 is connected to the cathode of the light emitting element 20, and the anode of the light emitting element 20 is connected to the output terminal 113 of the light-emission driving unit 110. Further, a p-channel MOS transistor is used as the MOS transistor 111, and the constant-current circuit 112 that supplies a source current is disposed. Further, the output terminal 113 is a virtual terminal of the light-emission driving unit 110, and is disposed on the drain of the MOS transistor 111 for convenience. This output terminal 113 can be disposed at an arbitrary position of the wiring between the light emitting element 20 and the light-emission driving unit 110. The inverting input of the comparison unit 101 of the malfunction detection unit 100 can be connected to the wiring between the light emitting element 20 and the light-emission driving unit 110 to detect the output voltage of the light-emission driving unit 110.

[Detection of malfunction]

Figure 3A:
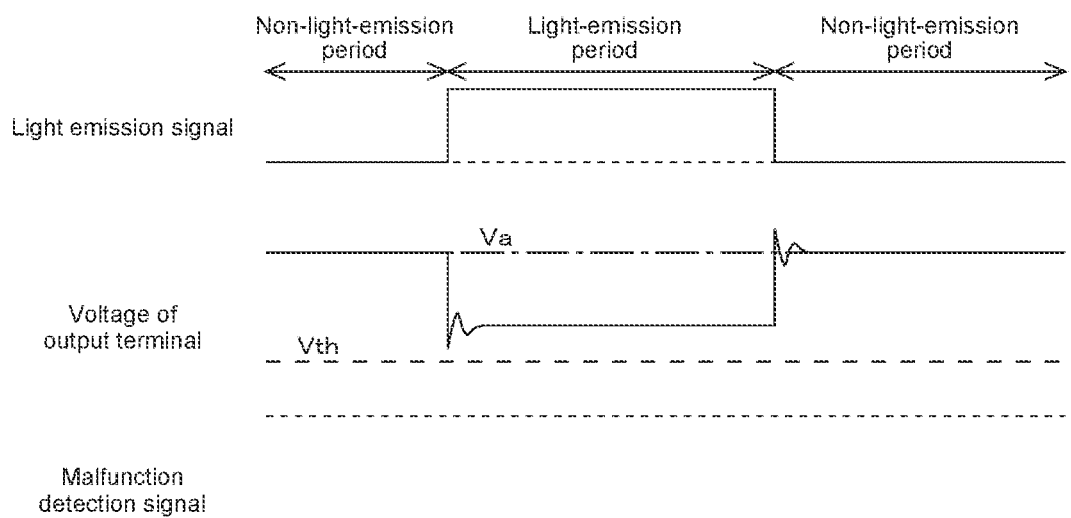
FIGS. 3A, 3B, and 3C are diagrams showing an example of detection of a malfunction according to the first embodiment of the present disclosure.
Figure 3B:
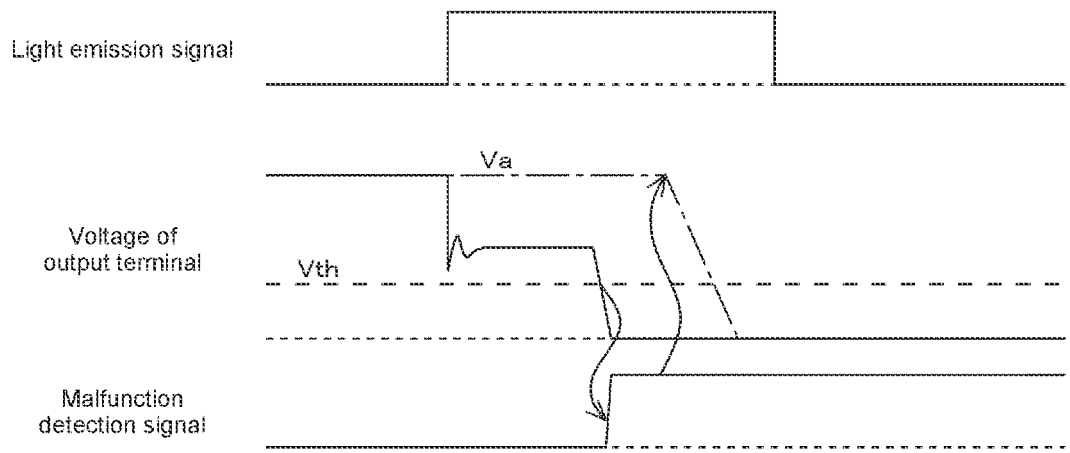
Figure 3C:
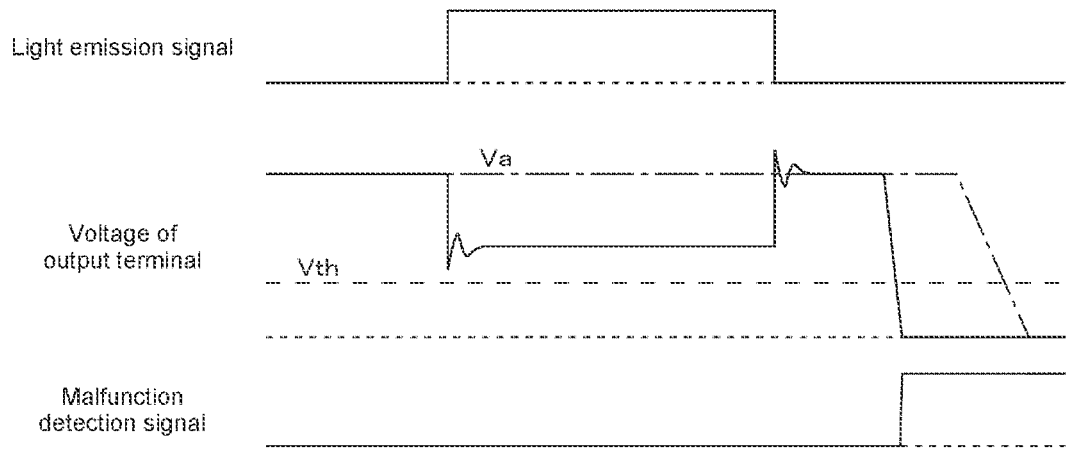

FIGS. 3A, 3B, and 3C are diagrams showing an example of detection of a malfunction according to the first embodiment of the present disclosure. FIGS. 3A 3B, and 3C are diagrams describing an operation of the malfunction detection unit 100. In the figure, the "light emission signal" represents the waveform of the binarized light emission signal output from the control unit 130. A period in which the light emission signal has a value "0" represents non-light-emission period, and a period in which the light emission signal has a value "1" represents the light-emission period. The "voltage of output terminal" represents the waveform of the voltage of the output terminal 113. The malfunction detection signal represents the waveform of the binarized malfunction detection signal. In the case where the malfunction detection unit 100 has detected a malfunction, the malfunction detection signal has a value "1". Further, the broken line in the figure represents the level of 0 V. The dotted line in the voltage of output terminal represents a threshold voltage Vth, and the one-dot chain line represents an applied voltage Va of the anode of the light emitting element 20, which is the power supply voltage supplied from the power source unit 140.

FIG. 3A represents the waveform in the normal state. When the light emission signal output from the control unit 130 transitions from the value "0" to "1", the on-voltage is output from the gate drive unit 120 and is applied to the gate of the MOS transistor 111 of the light-emission driving unit 110, and the MOS transistor 111 is made conductive. Since the light-emission current is supplied by the constant-current circuit 112, the voltage of the output terminal 113 is reduced. However, since the voltage of the output terminal 113 is higher than the threshold voltage Vth, no malfunction is detected. After that, when the light emission signal transitions from the value "1" to "0", the outputting of the on-voltage from the gate drive unit 120 is stopped, and the MOS transistor 111 transitions to the non-conductive state. For this reason, the voltage of the output terminal 113 returns to Va. Note that transient noise is superimposed on the voltage of the output terminal 113, the threshold voltage Vth needs to be set to a voltage lower than this transient noise voltage. This is to prevent a malfunction due to noise from occurring. Note that since the output of the gate drive unit 120 is substantially the same waveform as that of the light emission signal, description thereof is omitted.

FIG. 3B shows an example in which the constant-current circuit 112 has a malfunction in the light-emission period, and assumption is made that a short-circuit malfunction occurs in the constant-current circuit 112 in the light-emission period and the voltage of the output terminal 113 is reduced to substantially 0 V. Since the voltage of the output terminal 113 is lower than the threshold voltage Vth, the output of the comparison unit 101 of the malfunction detection unit 100 is inverted, and the malfunction detection signal transitions to the value "1". Next, this malfunction detection signal is input to the power source control unit 150, the supplying of power in the power source unit 140 is stopped, and Va is reduced to 0 V.

FIG. 3C shows an example in which the constant-current circuit 112 has a malfunction in the non-light-emission period. Similarly FIG. 3B, the voltage of the output terminal 113 is lower than the threshold voltage Vth. As a result, a malfunction is detected, and the supplying of power from the power source unit 140 is stopped.

As described above, in the light-emission period and the non-light-emission period, a malfunction of the light-emission driving unit 110 can be detected by the malfunction detection unit 100, and the supplying of power to the light emitting element 20 can be stopped via the power source control unit 150.

Note that the configuration of the light-emission driving device 10 is not limited to this example. For example, the power source control unit 150 may be omitted. In this case, an external circuit or an external apparatus of the light emitting device 1 needs to stop, on the basis of the malfunction detection signal, the supplying of power to the light emitting device 1 to stop the light emission of the light emitting element 20.

As described above, the malfunction detection unit 100 disposed in the light emitting device 1 according to the first embodiment of the present disclosure detects a malfunction of the light-emission driving unit 110 on the basis of the voltage of the output terminal 113 of the light-emission driving unit 110 that supplies the light-emission current to the light emitting element 20. As a result, it is possible to improve the safety of the light emitting device 1.

2. Second Embodiment

The light emitting device 1 according the above-mentioned first embodiment compares the voltage of the output terminal 113 and the threshold value with each other in the light-emission period and the non-light-emission period. Meanwhile, the light emitting device 1 according to a second embodiment of the present disclosure is different from that in the above-mentioned first embodiment in that the threshold value is changed between the light-emission period and the non-light-emission period.

[Light-Emission Driving Device]

Figure 4:
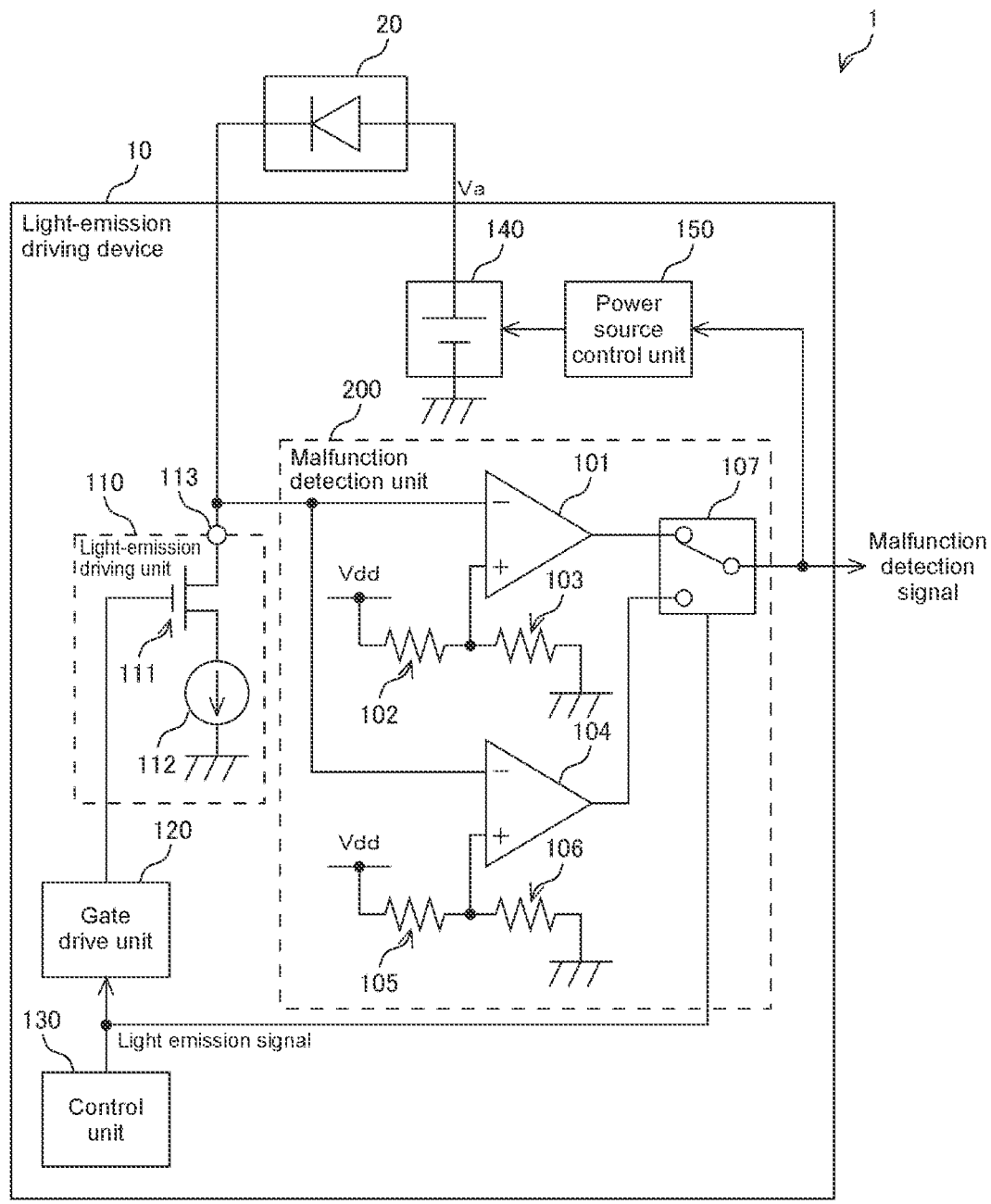
FIG. 4 is a diagram showing a configuration example of a light emitting device according to a second embodiment of the present disclosure.

FIG. 4 is a diagram showing a configuration example of a light emitting device according to the second embodiment of the present disclosure. Similarly to FIG. 2, FIG. 4 is a block diagram showing a configuration example of the light emitting device 1. The light emitting device 1 is different from that described in FIG. 2 in that a malfunction detection unit 200 is provided instead of the malfunction detection unit 100.

The malfunction detection unit 200 in FIG. 4 is different from the malfunction detection unit 100 described in FIG. 2 in that a comparison unit 104, a selection unit 107, and resistances 105 and 106 are further provided. The inverting input of the comparison unit 104 is connected to the output terminal 113. The resistance 105 is connected between the power source line Vdd and the non-inverting input of the comparison unit 104. The resistance 106 is connected between the non-inverting input of the comparison unit 104 and the ground. The outputs of the comparison units 101 and 104 are connected to two input terminals of the selection unit 107. The light emission signal from the control unit 130 is connected to the control input terminal of the selection unit 107, and the output of the selection unit 107 is connected to the output signal line of the malfunction detection unit 200. Since the other connections are the same as those in the malfunction detection unit 100 in FIG. 2, description thereof is omitted.

The comparison unit 104 compares the voltage of the output terminal 113 applied to the inverting input and the voltage applied to the non-inverting input with each other, similarly to the comparison unit 101. The threshold value that is the voltage obtained by dividing the power supply voltage Vdd by the resistances 105 and 106 is applied to the non-inverting input of the comparison unit 104. By setting the ratio of the resistances 105 and 106 to a value of the ratio of the resistances 102 and 103, the threshold value of the comparison unit 104 can be set to a value different from that of the comparison unit 101.

The selection unit 107 includes two input terminals and a control input terminal, and selects and outputs a signal input to one of the two input terminals, in accordance with a signal applied to the control input terminal. The selection unit 107 in the figure selects the output of one of the comparison units 101 and 104. The light emission signal is input to the control input terminal of the selection unit 107 in the figure, and the output of one of the comparison units 101 and 104 can be selected in accordance with the value of the light emission signal. For example, the comparison unit 101 can be selected in the light-emission period in which the light emission signal has a value "1", and the comparison unit 104 can be selected in the non-light-emission period in which the light emission signal has a value "0". As a result, it is possible to compare the voltages of the output terminal 113 with each other between the light-emission period and the non-light-emission period by using different threshold values. For example, a threshold value higher than that of the light-emission period can be set for the non-light-emission period. As a result, it is possible to easily detect a short circuit of the light-emission driving unit 110.

In the case where the MOS transistor 111 is short-circuited or pseudo-short-circuited, the light-emission current is supplied to the light emitting element 20 in the non-light-emission period, and light is emitted despite the non-light-emission period. Even in such a case, by setting the threshold value in the non-light-emission period to be higher than the threshold value in the light-emission period, it is possible to detect the short circuit of the MOS transistor 111, and the like.

[Detection of malfunction]

Figure 5A:
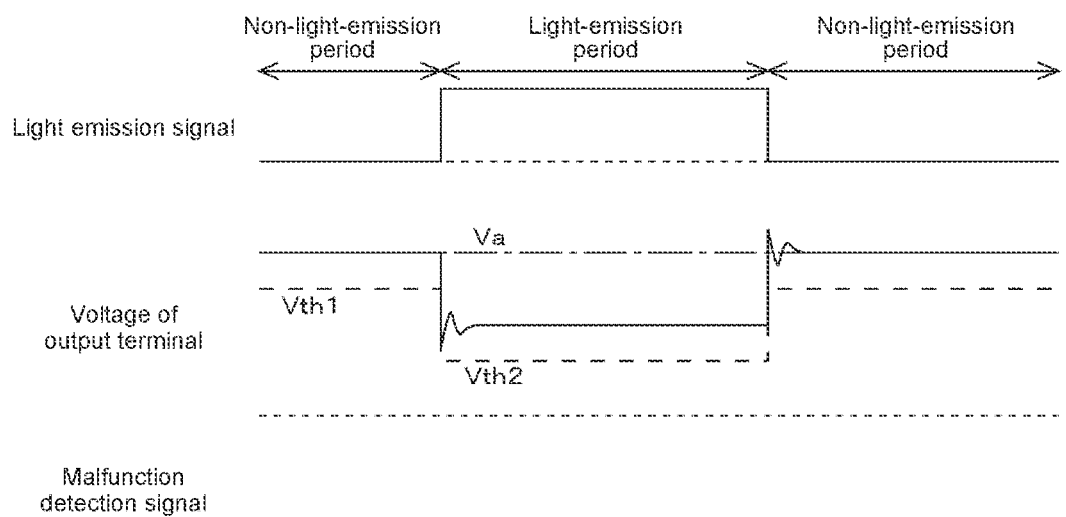
FIGS. 5A, 5B, and 5C are diagrams showing an example of detection of a malfunction according to the second embodiment of the present disclosure.
Figure 5B:
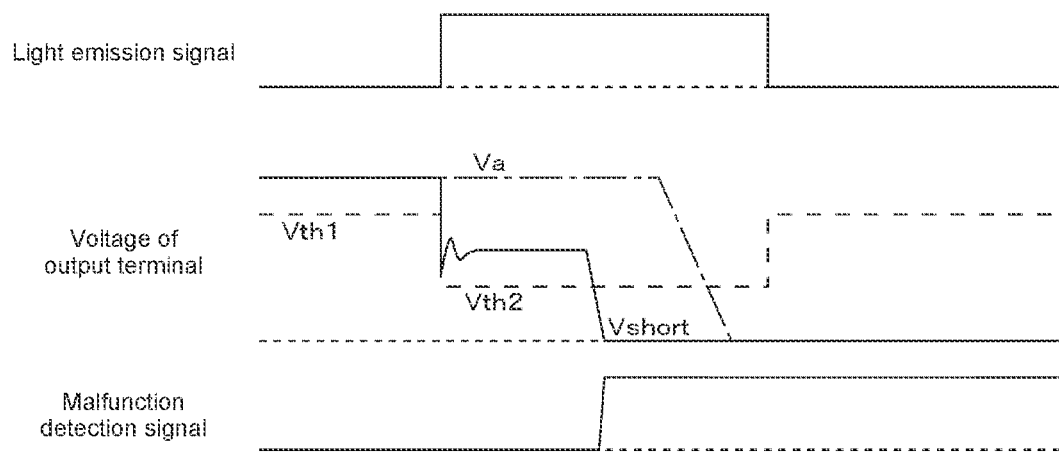
Figure 5C:
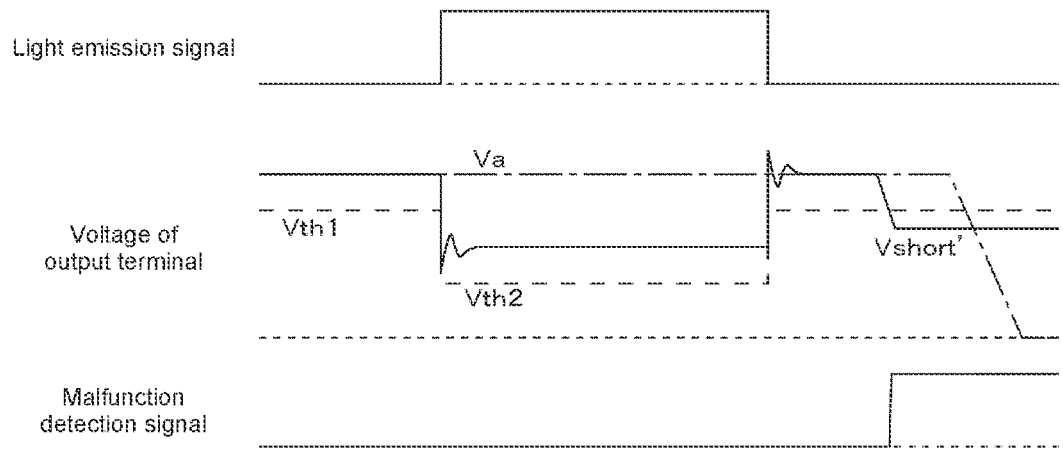

FIGS. 5A, 5B, and 5C are diagrams showing an example of detection of a malfunction according to the second embodiment of the present disclosure. FIGS. 5A, 5B, and 5C are diagrams describing an operation of the malfunction detection unit 200. Components common to those in FIGS. 3A, 3B, and 3C are denoted by the same reference symbols, and description thereof is omitted.

FIG. 5A represents the waveform in the normal state. Vth1 and Vth2 in the figure respectively represent the threshold voltages of the non-light-emission period and the light-emission period. Vth1 corresponds to the threshold voltage set by the resistances 105 and 106 in FIG. 4, and Vth2 corresponds to the threshold voltage set by the resistances 102 and 103 in FIG. 4. As shown in the figure, the threshold voltage Vth1 can be set to a value higher than the voltage of the output terminal 113 in the light-emission period.

FIG. 5B shows an example in which the constant-current circuit 112 has a malfunction in the light-emission period, and assumption is made that a short-circuit malfunction occurs in the constant-current circuit 112 in the light-emission period and the voltage the output terminal 113 is reduced to a voltage (Vshort) of substantially 0 V. Since the voltage of the output terminal 113 is lower than the threshold voltage Vth2, a malfunction is detected by the malfunction detection unit 200.

FIG. 5C shows an example in which the constant-current circuit 112 has a malfunction in the non-light-emission period. Unlike FIG. 3C, assumption is made that a pseudo-short circuit occurs in the constant-current circuit 112 in the example. This pseudo-short circuit causes the voltage of the output terminal 113 to be a voltage (Vshort') higher than the voltage in the light-emission period. Since this Vshort' is a voltage lower than the threshold voltage Vth1, a malfunction is detected by the malfunction detection unit 200 and the supplying of power to the light emitting element 20 is stopped. Note that in the case where a short circuit and a pseudo-short circuit occur in the MOS transistor 111, the voltage of the output terminal 113 in the non-light-emission period is substantially the same as that in the light-emission period. Also in this case, since the voltage of the output terminal 113 is lower than the threshold voltage Vth1, a malfunction can be detected.

Since the other configurations of the light emitting device 1 are similar to the configurations of the light emitting device 1 described in the first embodiment of the present disclosure, description thereof is omitted.

As described above, the light emitting device 1 according to the second embodiment of the present disclosure detects a malfunction on the basis of different threshold values between the light-emission period and the non-light-emission period by the malfunction detection unit 200. As a result, it is possible to detect a pseudo-short circuit of the constant-current circuit 112 and a short circuit and a pseudo-short circuit of the MOS transistor 111. It is possible to further improve the safety of the light emitting device 1.

3. Third Embodiment

The light emitting device 1 according to the above-mentioned first embodiment causes the light emitting element 20 to continuously emit light during the light-emission period. Meanwhile, the light emitting device 1 according to a third embodiment of the present disclosure is different from that in the above-mentioned first embodiment in that the light emitting element 20 is caused to intermittently emit light during the light-emission period.

[Light-Emission Driving Device]

Figure 6:
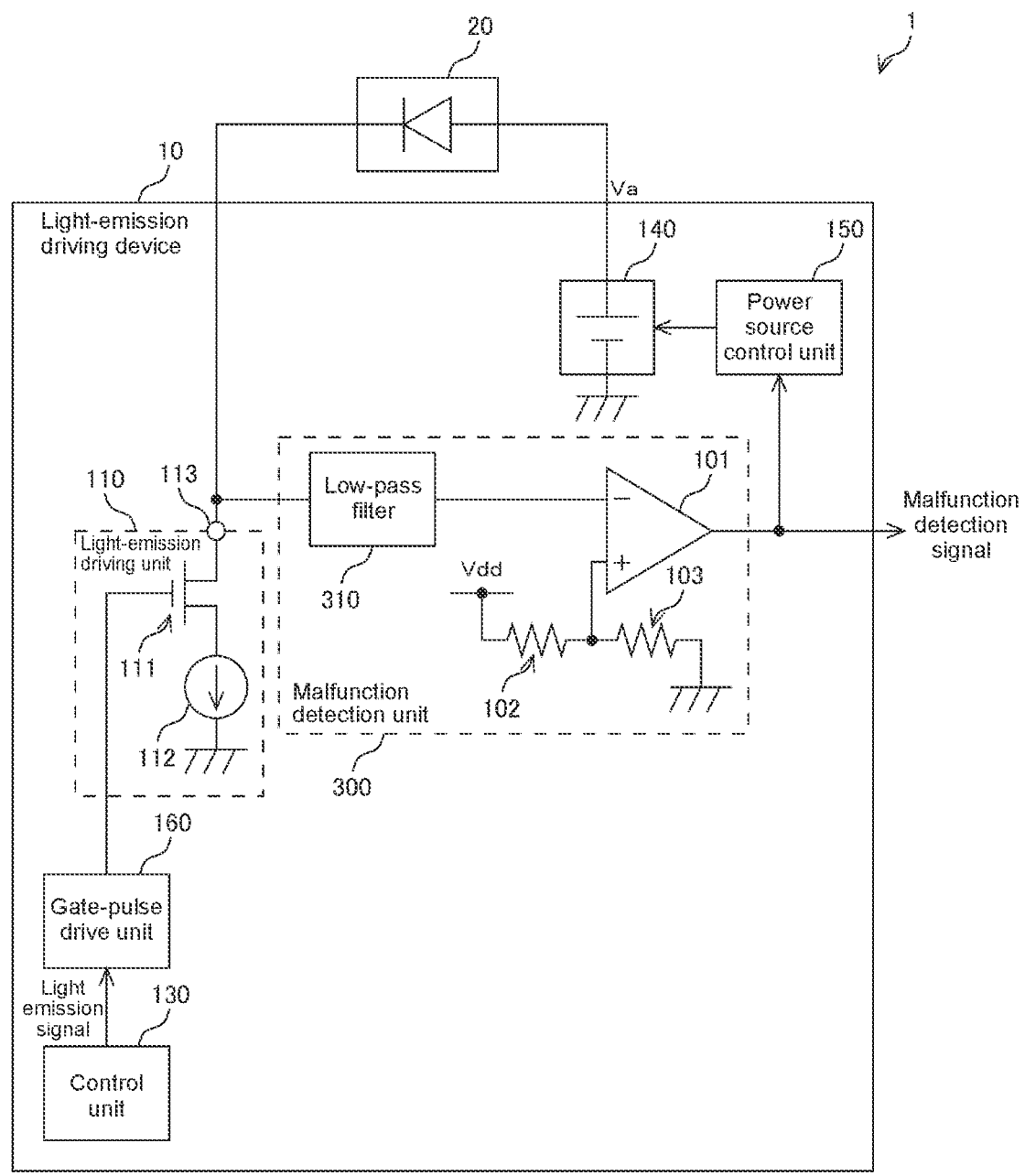
FIG. 6 is a diagram showing a configuration example of a light emitting device according to a third embodiment of the present disclosure.

FIG. 6 is a diagram showing a configuration example of a light emitting device according to the third embodiment of the present disclosure. Similarly to FIG. 2, FIG. 6 is a block diagram showing a configuration example of the light emitting device 1. The light emitting device 1 is different from that described in FIG. 1 in that a gate-pulse drive unit 160 and a malfunction detection unit 300 are provided instead of the gate drive unit 120 and the malfunction detection unit 100.

The gate-pulse drive unit 160 generates a gate voltage of a plurality of pulses in the light-emission period and applies the generated voltage to the gate of the MOS transistor 111 of the light-emission driving unit 110. This gate-pulse drive unit 160 causes the MOS transistor 111 to drive to alternately repeat the conduction and non-conduction in the light-emission period. As a result, the light-emission current is intermittently supplied to the light emitting element 20. The malfunction detection unit 300 detects a malfunction of the light-emission driving unit 110 for each of the light-emission currents intermittently supplied.

In the case of using the light emitting device 1 for the distance measurement by the ToF method, when measuring a distance to a subject that is at a relatively long distance, it is possible to measure the distance by directly measuring the time from the start of the application of a laser beam to the detection of reflected light. However, in the case of a subject that is at a short distance, since the time from the start of the application of a laser beam to the detection of reflected light is short, the detection accuracy of the distance is reduced. In such a case, a method of measuring the distance by intermittently applying a laser beam and detecting the phase difference between the laser beam and the pulse-train-shaped reflected light is adopted. This is a method using an image sensor in which two types of pixels, the pixels repeatedly performing light emission and non-light emission of a laser beam at a duty of 50% in the light emitting device and performing photoelectric conversion in synchronization with the periods of light emission and non-light-emission. The charges generated by the photoelectric conversion are accumulated in the respective pixels for each of the periods of light emission and non-light-emission. The phase difference between the laser beam emitted by the light emitting device and the reflected laser beam is calculated on the basis of the ratio of charges accumulated in the two types of pixels, and thus it is possible to measure the distance to a subject.

The light emitting device 1 in the figure can be used for such a distance measuring system for detecting the phase difference with respect to the reflected light. Details of the driving of the light emitting element 20 will be described below.

The malfunction detection unit 300 in the figure is different from the malfunction detection unit 100 described in FIG. 2 in that a low-pass filter 310 is provided. This low-pass filter 310 is a filter that is disposed between the output terminal 113 and the inverting input of the comparison unit 101, causes a low-frequency component of the output of the output terminal 113 to pass therethrough, and attenuates the high-frequency component. By disposing this low-pass filter 310, it is possible to remove, for example, transient noise that occurs when the MOS transistor 111 transitions from the non-conductive state to the conductive state.

[Detection of malfunction]

Figure 7:
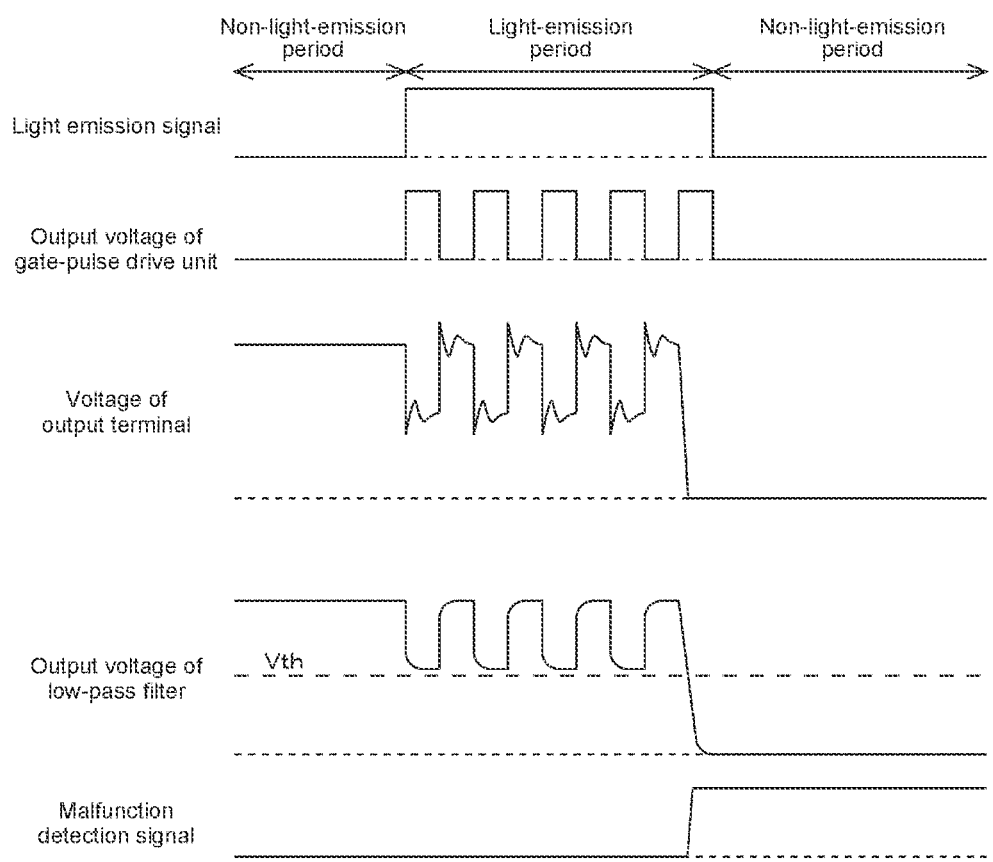
FIG. 7 is a diagram showing an example of detection of a malfunction according to the third embodiment of the present disclosure.

FIG. 7 is a diagram showing an example of detection of a malfunction according to the third embodiment of the present disclosure. FIG. 7 is a diagram describing the operation of the light-emission driving unit 110 and the effect of the low-pass filter 310. The "output voltage of gate-pulse drive unit" in the figure is the output voltage of the gate-pulse drive unit 160, and represents the waveform of the gate voltage of the MOS transistor 111. The "output voltage of low-pass filter" represents the waveform of the voltage of the output terminal 113, which has passed through the low-pass filter 310. The other components common to those in FIGS. 3A, 3B, and 3C are denoted by the same reference symbols.

The light emission signal in the figure has a waveform similar to that in FIGS. 3A, 3B, and 3C. Meanwhile, in the output voltage of the gate-pulse drive unit 160, the waveform in the light-emission period is a waveform of a plurality of consecutive rectangular waves. The consecutive rectangular waves pulse-drive the MOS transistor 111. The light-emission current of the light-emission driving unit 110 intermittently flows in the light-emission period, and also the voltage of the output terminal 113 has a pulse shape. Further, transient noise is superimposed for each rising and falling of the pulse. The transient noise is removed by causing it to pass through the low-pass filter 310. As shown in the figure, the output voltage of the low-pass filter 310 has a waveform from which transient noise that is a high-frequency component has been removed. For this reason, the threshold voltage Vth can be set to a value higher than the threshold voltage Vth. The threshold voltage Vth can be set to a value close to the output voltage of the light-emission driving unit 110 in the normal state, and the detection accuracy of a pseudo-short circuit can be improved.

When the light-emission driving unit 110 is short-circuited in the light-emission period and one of the plurality of pulses of the voltage of the output terminal 113 is lower than the threshold voltage Vth, a malfunction is detected by the malfunction detection unit 300.

Note that an integrating circuit for integrating the voltage of the output terminal 113 of the plurality of pulses may be disposed instead of the low-pass filter 310 to detect a malfunction on the basis of the integrated voltage. Also in this case, the influence of noise can be removed.

Since the other configurations of the light emitting device 1 are similar to the configurations of the light emitting device 1 described in the first embodiment of the present disclosure, description thereof is omitted.

As described above, in the light emitting device 1 according to the third embodiment of the present disclosure, the light-emission driving unit 110 is pulse-driven to intermittently supply the light-emission current to the light emitting element 20. Also in this case, a malfunction can be detected by the malfunction detection unit 300 for each of the light-emission currents intermittently supplied. Further, by disposing the low-pass filter 310 in the malfunction detection unit 300, it is possible to remove transient noise of the voltage of the output terminal 113, and set the threshold voltage to a value close to the voltage of the output terminal 113 in the normal state. It is possible to improve the detection accuracy of a malfunction.

Note that the malfunction detection unit 200 described in FIG. 4 is applicable to the light-emission driving device 10 in FIG. 6. Further, the gate-pulse drive unit 160 and the malfunction detection unit 300 described in FIG. 6 is applicable also to the light-emission driving device 10 in FIG. 4.

4. Application Example to Camera

The technology according to the present disclosure (the present technology) is applicable to various products. For example, the present technology may be realized as a light emitting device to be mounted on an imaging apparatus such as a camera.

Figure 8:
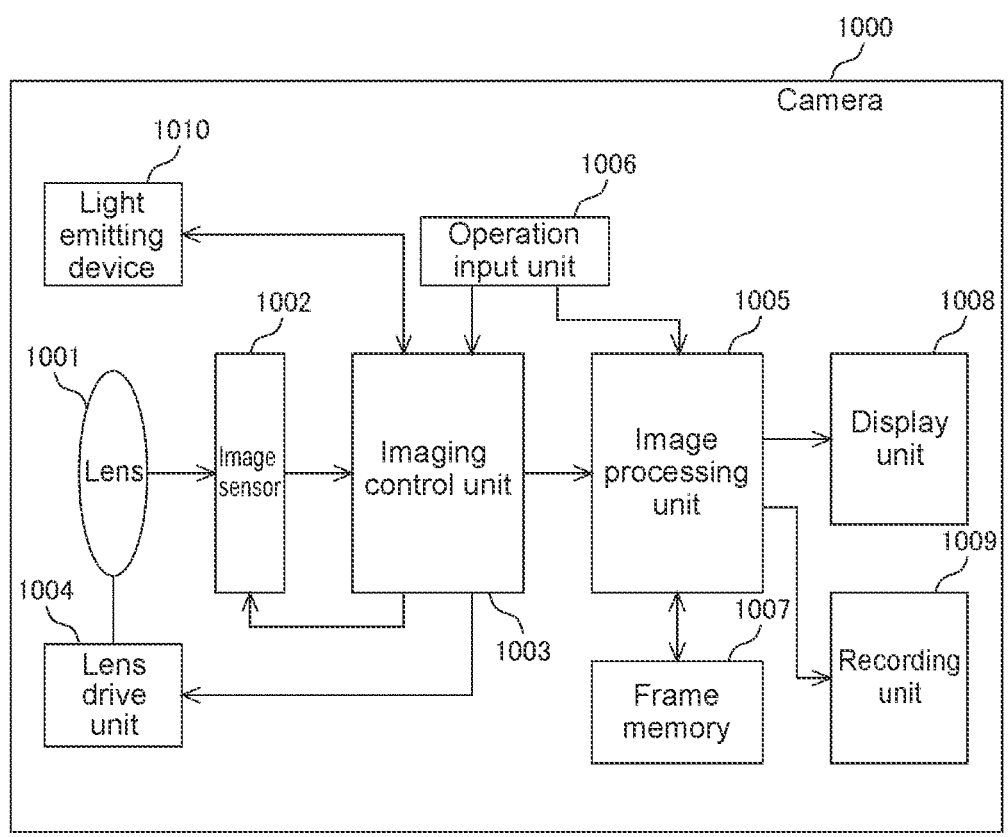
FIG. 8 is a block diagram illustrating an example of a schematic configuration of a camera that is an example of an imaging apparatus to which the present technology may be applied.

FIG. 8 is a block diagram illustrating an example of a schematic configuration of a camera that is an example of an imaging apparatus to which the present technology may be applied. A camera 1000 in the figure includes a lens 1001, an image sensor 1002, an imaging control unit 1003, a lens drive unit 1004, an image processing unit 1005, an operation input unit 1006, a frame memory 1007, a display unit 1008, a recording unit 1009, and a light emitting device 1010.

The lens 1001 is an imaging lens of the camera 1000. This lens 1001 collects light from a subject, and causes the collected light to enter the image sensor 1002 described below to form an image of the subject.

The image sensor 1002 is a semiconductor device that images the light from the subject that is collected by the lens 1001. This image sensor 1002 generates an analog image signal corresponding to the applied light, and converts the analog image signal into a digital image signal to output the digital image signal.

The imaging control unit 1003 controls imaging performed by the image sensor 1002. This imaging control unit 1003 performs control of the image sensor 1002 by generating a control signal and outputting the control signal to the image sensor 1002. Further, the imaging control unit 1003 is capable of performing autofocusing in the camera 1000 on the basis of the image signal output from the image sensor 1002. Here, the autofocusing is a system that detects a focal position of the lens 1001 and automatically adjusts the focal position. It is possible to use, as the autofocusing, a method of detecting a focal position by detecting an image-plane phase difference using a phase difference pixel disposed in the image sensor 1002 (image-plane-phase-difference autofocusing). Further, it is also possible to apply a method (contrast autofocusing) that includes detecting, as the focal position, a position in which an image exhibits a highest contrast. The imaging control unit 1003 adjusts the position of the lens 1001 through the lens drive unit 1004 on the basis of the detected focal position, and performs autofocusing. Note that the imaging control unit 1003 can include, for example, a digital signal processor (DSP) on which firmware is mounted.

The lens drive unit 1004 drives the lens 1001 on the basis of control performed by the imaging control unit 1003. This lens drive unit 1004 is capable of driving the lens 1001 by changing the position of the lens 1001 using a built-in motor.

The image processing unit 1005 processes the image signal generated by the image sensor 1002. Demosaicking for generating an image signal of an insufficient color among image signals corresponding to red, green, and blue for each pixel, noise reduction for removing noise from an image signal, encoding of an image signal, and the like correspond to this processing. The image processing unit 1005 can include, for example, a microcomputer on which firmware is mounted.

The operation input unit 1006 receives an operation input from a user of the camera 1000. As this operation input unit 1006, for example, a push button or a touch panel can be used. An operation input received by the operation input unit 1006 is transmitted to the imaging control unit 1003 and the image processing unit 1005. After that, the processing corresponding to the operation input, e.g., processing such as imaging a subject is started.

The frame memory 1007 is a memory that stores therein a frame that is an image signal for a single screen. This frame memory 1007 is controlled by the image processing unit 1005, and holds a frame in the process of image processing.

The display unit 1008 displays thereon an image processed by the image processing unit 1005. As this display unit 1008, for example, a liquid crystal panel can be used.

The recording unit 1009 records therein an image processed by the image processing unit 1005. As this recording unit 1009, for example, a memory card or a hard disk can be used.

The light emitting device 1010 emits a laser beam for measuring a distance to a subject. Further, the above-mentioned imaging control unit 1003 further controls the light emitting device 1010 and measures a distance to the subject. The measurement of the distance to the subject in the camera 1000 can be performed as follows. First, the imaging control unit 1003 controls the light emitting device 1010 to emit a laser beam. Next, the laser beam reflected by the subject is detected by the image sensor 1002. Next, the imaging control unit 1003 measures the time from the mission of a laser beam in the light emitting device 1010 to the detection of the laser beam in the image sensor 1002 to calculate the distance to the subject.

The camera to which the present disclosure may be applied has been described above. The present technology is applicable to the light emitting device 1010 of the configurations described above. Specifically, the light emitting device 1 described in FIG. 1 can be applied to the light emitting device 1010. A malfunction of the light emitting device 1 can be detected by applying the light emitting device 1 to the light emitting device 1010. It is possible to improve the safety when measuring the distance.

Note that although a camera has been described here as an example, the technology according to the present invention may be applied to, for example, a mobile device, an unmanned conveyance vehicle, or the like in addition to the camera.

Finally, the description of the above-mentioned embodiments is an example of the present disclosure, and the present disclosure is not limited to the above-mentioned embodiments. Therefore, it goes without saying that various modifications can be made depending on the design and the like without departing from the technical idea according to the present disclosure even in the case of an embodiment other than the above-mentioned embodiments.

Further, the drawings in the above-mentioned embodiments are schematic, and the ratio of the dimensions of the respective units and the like do not necessarily coincide with real ones. Further, it goes without saying that the drawings have different dimensional relationships and different ratios of dimensions with respect to the same portion.

It should be noted that the present technology may take the following configurations.

(1) A malfunction detection device that detects, on a basis of a voltage of an output terminal, a malfunction of a light-emission driving unit, the output terminal being a terminal in a light-emission driving unit that supplies a light-emission current for causing a light emitting element to emit light during a light-emission period, the terminal supplying the light-emission current.

(2) The malfunction detection device according to (1) above, in which the malfunction is detected in the light-emission period and a non-light-emission period in which light emission of the light emitting element is stopped.

(3) The malfunction detection device according to (2) above, in which the malfunction is detected by comparing the voltage of the output terminal and a predetermined threshold value with each other.

(4) The malfunction detection device according to (3) above, in which the predetermined threshold value in the non-light-emission period is different from that in the light-emission period.

(5) The malfunction detection device according to any one of (1) to (4) above, in which the malfunction is detected, where the light-emission driving unit intermittently supplies the light-emission current in the light-emission period, for each of the intermittently supplied light-emission currents.

(6) The malfunction detection device according to any one of (1) to (5) above, further including a low-pass filter that removes a high-frequency component of the voltage of the output terminal, in which the malfunction is detected on a basis of the voltage of the output terminal from which the high-frequency component has been removed.

(7) A light-emission driving device, including:

a light-emission driving unit that supplies a light-emission current for causing a light emitting element to emit light during a light-emission period; and a malfunction detection unit that detects a malfunction of the light-emission driving unit on a basis of a voltage of an output terminal, the output terminal being a terminal in the light-emission driving unit, the terminal supplying the light-emission current.

(8) The light-emission driving device according to (7) above, further including:

a power source unit that supplies power for causing the light-emission current to flow in the light emitting element; and a power source control unit that causes, where the malfunction is detected, the power source unit to stop supplying the power.

(9) A light emitting device, including:

a light emitting element;

a light-emission driving unit that supplies a light-emission current for causing the light emitting element to emit light during a light-emission period; and a malfunction detection unit that detects a malfunction of the light-emission driving unit on a basis of a voltage of an output terminal, the output terminal being a terminal in the light-emission driving unit, the terminal supplying the light-emission current.

REFERENCE SIGNS LIST 1 light emitting device
10 light-emission driving device
20 light emitting element
100, 200, 300 malfunction detection unit
101, 104 comparison unit
107 selection unit
110 light-emission driving unit
111 MOS transistor
112 constant-current circuit
113 output terminal
120 gate drive unit
130 control unit
140 power source unit
150 power source control unit
160 gate-pulse drive unit
310 low-pass filter
1000 camera
1002 image sensor
1005 image processing unit
1003 imaging control unit
1010 light emitting device

The invention claimed is:

1. A malfunction detection device, comprising:
circuitry configured to:
detect a malfunction of a light-emission driving unit based on a voltage of an output terminal in the light-emission driving unit, wherein
the light-emission driving unit supplies a light-emission current to cause a light emitting element to emit light during a light-emission period,
the output terminal supplies the light-emission current,
the malfunction is detected in the light-emission period and a non-light-emission period, and
the light emitting element stops emission of the light in the non-light-emission period.

2. The malfunction detection device according to claim 1, wherein the malfunction is detected based on comparison of the voltage of the output terminal and a threshold voltage.

3. The malfunction detection device according to claim 2, wherein
the threshold voltage is different in the non-light-emission period and the light-emission period.

4. The malfunction detection device according to claim 1, wherein
the light-emission driving unit intermittently supplies the light-emission current in the light-emission period as a plurality of intermittently supplied light-emission currents, and
the malfunction is detected for each of the plurality of intermittently supplied light-emission currents.

5. The malfunction detection device according to claim 1, further comprising
a low-pass filter configured to remove a high-frequency component of the voltage of the output terminal,
wherein the malfunction is detected based on the voltage of the output terminal with the high-frequency component removed.

6. A light-emission driving device, comprising:
a light-emission driving unit configured to:
supply a light-emission current to cause a light emitting element to emit light during a light-emission period; and
cause the light emitting element to stop emission of the light during a non-light-emission period; and a malfunction detection unit configured to detect a malfunction of the light-emission driving unit based on a voltage of an output terminal in the light-emission driving unit, wherein the output terminal supplies supplying the light-emission current, and the malfunction is detected in the light-emission period and the non-light-emission period.

7. The light-emission driving device according to claim 6, further comprising:

a power source unit configured to supply power to cause the light-emission current to flow in the light emitting element; and a power source control unit configured to cause, based on the detection of the malfunction, the power source unit to stop supply of the power.

8. A light emitting device, comprising:

a light emitting element;

a light-emission driving unit configured to:

supply a light-emission current to cause the light emitting element to emit light during a light-emission period; and cause the light emitting element to stop emission of the light during a non-light-emission period; and a malfunction detection unit configured to detect a malfunction of the light-emission driving unit based on a voltage of an output terminal in the light-emission driving unit, wherein the output terminal supplies the light-emission current, and the malfunction is detected in the light-emission period and the non-light-emission period.

\* \* \* \* \*